(12) United States Patent
Wise et al.

(10) Patent No.: US 6,903,023 B2
(45) Date of Patent: Jun. 7, 2005

(54) IN-SITU PLASMA ETCH FOR TERA HARD MASK MATERIALS

(75) Inventors: Richard S. Wise, New Windsor, NY (US); Sadanand V. Deshpande, Fishkill, NY (US); Wendy Yan, Somers, NY (US); Soctt D. Allen, Dumont, NJ (US); Arpan P. Mahorowala, Bronxville, NY (US)

(73) Assignee: International Business Machines Corporation, Armonk, NY (US)

( * ) Notice: Subject to any disclaimer, the term of this patent is extended or adjusted under 35 U.S.C. 154(b) by 271 days.

(21) Appl. No.: 10/244,362

(22) Filed: Sep. 16, 2002

(65) Prior Publication Data

US 2004/0053504 A1 Mar. 18, 2004

(51) Int. Cl.[7] .................. H01L 21/302; H01L 21/461
(52) U.S. Cl. .................. 438/705; 438/714; 438/725
(58) Field of Search ................ 438/705, 714, 438/725

(56) References Cited

U.S. PATENT DOCUMENTS

| | | |
|---|---|---|
| 5,354,985 A | 10/1994 | Quate |
| 5,363,697 A | 11/1994 | Nakagawa |
| 5,372,930 A | 12/1994 | Colton et al. |
| 5,394,741 A | 3/1995 | Kajimura et al. |
| 5,470,661 A | 11/1995 | Bailey et al. |
| 5,569,501 A | 10/1996 | Bailey et al. |
| 5,730,940 A | 3/1998 | Nakagawa |
| 5,807,758 A | 9/1998 | Lee et al. |
| 5,886,102 A | 3/1999 | Sinta et al. |
| 5,926,740 A | 7/1999 | Forbes et al. |
| 5,939,709 A | 8/1999 | Ghislain et al. |
| 5,969,821 A | 10/1999 | Muramatsu et al. |
| 6,054,379 A * | 4/2000 | Yau et al. .................. 438/623 |
| 6,057,547 A | 5/2000 | Park et al. |
| 6,072,227 A * | 6/2000 | Yau et al. .................. 257/642 |
| 6,104,030 A | 8/2000 | Chiba et al. |
| 6,118,121 A | 9/2000 | Ando et al. |
| 6,146,593 A | 11/2000 | Pinkel et al. |
| 6,165,335 A | 12/2000 | Lennox et al. |
| 6,190,839 B1 | 2/2001 | Pavelchek et al. |
| 6,207,583 B1 * | 3/2001 | Dunne et al. .................. 438/725 |
| 6,214,637 B1 | 4/2001 | Kim et al. |
| 6,316,167 B1 | 11/2001 | Angelopoulos et al. |
| 6,472,306 B1 * | 10/2002 | Lee et al. .................. 438/623 |
| 6,670,276 B1 * | 12/2003 | Suemasa et al. .................. 438/706 |
| 6,724,069 B2 * | 4/2004 | Dalton et al. .................. 257/642 |

* cited by examiner

*Primary Examiner*—Duy-Vu N. Deo
(74) *Attorney, Agent, or Firm*—Whitham, Curtis & Christofferson, P.C.; Jay H. Anderson

(57) ABSTRACT

A method for removing carbon from or stripping a TERA layer. The method includes exposing the TERA layer to a plasma containing an effective amount of nitrogen, and, optionally, oxygen or fluorine. The method is compatible with fluorine based etching systems, and may thus be performed in the same etching system as other etching steps. For example, the method may be performed in the same system as a fluorine based plasma etch for oxide or nitride. The invention includes the method of stripping a TERA layer, etching an oxide layer, and etching a nitride layer in situ in the same etching system. The method is performed at low ion energies to avoid damaging oxide or nitride layers under the TERA film and to provide good selectivity.

21 Claims, 2 Drawing Sheets

IN-SITU PLASMA ETCH FOR TERA HARD MASK MATERIALS

FIELD OF THE INVENTION

The present invention relates generally to semiconductor processing. More particularly, it relates to a method for selectively etching materials used as hard masks and anti-reflection coatings.

BACKGROUND OF THE INVENTION

For a number of reasons, increasing device density in semiconductor devices requires the use of photoresist having a reduced thickness. Since resist may be too thin to use for patterning directly, hard mask materials such as TERA (Tunable Etch-Resistant ARC, where ARC stands for Anti-Reflection Coating) have been developed to enable patterning. The photoresist is used only to image a thin hardmask material, which subsequently serves as a pattern transfer mask for underlying films (e.g. silicon dioxide, silicon nitride and the like). TERA hard mask layers can in some applications provide simultaneous hard mask and ARC functionality.

TERA materials are defined as R—C—H—X, where R is selected from Si, Ge, B, and Sn; X is selected from O, N, S, and F; C is carbon, and H is hydrogen. The ranges include R from 0–95%, C from 0–95%, H from 0–50%, and X from 0–70% (by atomic percent). TERA materials are disclosed in U.S. Pat. No. 6,316,167 and U.S. Pat. No. 5,926,740, the disclosures of which are hereby incorporated by reference.

TERA is a desirable hard mask material because it has a low sputter yield (and hence is an effective mask material) in plasma etches for silicon dioxide (e.g. fluorine-based etch plasmas). Specifically, the TERA film commonly used as a hard mask for silicon dioxide contains a high level of carbon (e.g. about 20%). In many instances, it is necessary to open a composite stack comprising TERA, silicon dioxide, and silicon nitride below the oxide. Optionally, silicon under the nitride may be etched as well. Fluorocarbon based etching chemistry is preferred for etching the oxide and nitride. Hence, using a fluorocarbon-based or fluorine-compatible etching chemistry to strip the TERA layer after oxide etching would simplify processing. It would be most preferable to strip the TERA layer in situ after it has been used as a hard mask.

Since TERA is resistant to fluorine-based plasma etches, it is difficult to strip in situ when fluorine based processing is used. In particular, semiconductor manufacturers are currently experiencing difficulty in stripping TERA mask materials without also damaging underlying layers. Typically, stripping the TERA layer requires removing the wafer from the fluorine system and stripping the TERA in a chlorine based system. This increases the cost and complexity of using TERA hard mask/ARC layers, which are otherwise highly desirable. TERA materials can also be etched simultaneously with the nitride etch, but this approach causes other problems. Specifically, sidewalls in the nitride layer can become sloped, which can be undesirable for certain devices. This is primarily due to the additional C and Si load of the residual mask on the nitride etch process.

It is not practical to strip the TERA material with the same process used to pattern it from the resist mask because this unfavorably alters the profile of the oxide etch. Therefore, in the state of the art, there appears to be no simple, practical method for stripping TERA materials in a processing system employing fluorine chemistry.

It would be an advance in the art of semiconductor processing, and would facilitate the application of smaller feature sizes in semiconductor devices, to provide a method for stripping TERA materials in a fluorine based etching system. It would be particularly useful to provide a TERA strip method that does not unfavorably alter the profiles of underlying oxide or nitride films.

SUMMARY OF THE INVENTION

The present invention provides a method for removing carbon from TERA materials, which in turn renders the TERA material etchable in a plasma chemistry compatible with a fluorine based etching system.

In accordance with the invention, a method is provided which includes the step of exposing the TERA material to a plasma containing an effective amount of nitrogen. The nitrogen binds the carbon in the TERA material, forming volatile species and thereby removing the carbon from the TERA material. The plasma may further contain oxygen or fluorine. If the plasma contains fluorine, the plasma preferably has a F/(N+O) ratio less than 0.25 or 0.1. A low fluorine content tends to provide selectivity over oxide.

During the etching step, cyanide species (CN) evolved from the TERA film may be detected. Monitoring of CN levels in the plasma or exhaust may conveniently permit process endpoint detection.

Preferably, relatively low power is applied to the wafer during plasma exposure. For example, less than 0.4 Watts/$cm^2$, or less than 0.16 Watts/$cm^2$ can be applied. The amount of power applied can even be zero in the case of decoupled plasmas (e.g. inductively excited plasmas).

The TERA material may comprise Si—C—H—O or any other TERA material. Also, after the nitrogen plasma exposure step, the carbon-depleted TERA material may remain, or be removed in the same or distinct etching step. The TERA material may be disposed on an oxide layer.

The present method also includes a method for processing a semiconductor device having a patterned TERA layer disposed on an oxide layer, which is disposed on a nitride layer. In this method, the TERA layer is used to pattern the oxide, and then the TERA layer is depleted of carbon, and possibly completely stripped. Then, the patterned transferred to the oxide is used to pattern the nitride layer. Preferably, all these steps are performed in the same vacuum system without removing the semiconductor device from vacuum. The plasma preferably has a F/(N+O) ratio less than 0.25. The plasma may include oxygen.

In another aspect of the invention, carbon is depleted from a TERA layer by exposing it to a plasma containing oxygen and an effective amount of nitrogen.

DETAILED DESCRIPTION OF PREFERRED EMBODIMENTS

The present invention provides a method for etching TERA materials in a system employing or compatible with fluorine based etching plasmas. It has been discovered that the addition of nitrogen to an oxygen plasma provides a high etch rate of TERA materials. Oxygen and nitrogen plasmas are compatible with fluorine-based etching systems (that is, they do not erode silicon mechanical components), so the wafer does not need to be removed from the fluorine system to remove the TERA layer. Nitrogen/oxygen plasmas also do not cause formation of undesired profiles in underlying oxide and nitride films. Without being limited to a specific mechanism for this effect, it is believed that the enhanced etch rate caused by adding nitrogen to an oxygen plasma is caused by weakening or breakage of silicon-carbon bonds in the TERA material. In the present inventive method, carbon is removed from the TERA film due to the presence of nitrogen, rendering the film more etchable in the oxygen plasma. The present method does not require fluorine. The present invention allows the use of TERA hard mask/ARC materials without requiring that the wafers be removed from the system to strip the TERA layer. This allows a greater number of steps to be performed in the same system, which affords a simpler, less expensive, and more efficient process.

Figure 1:
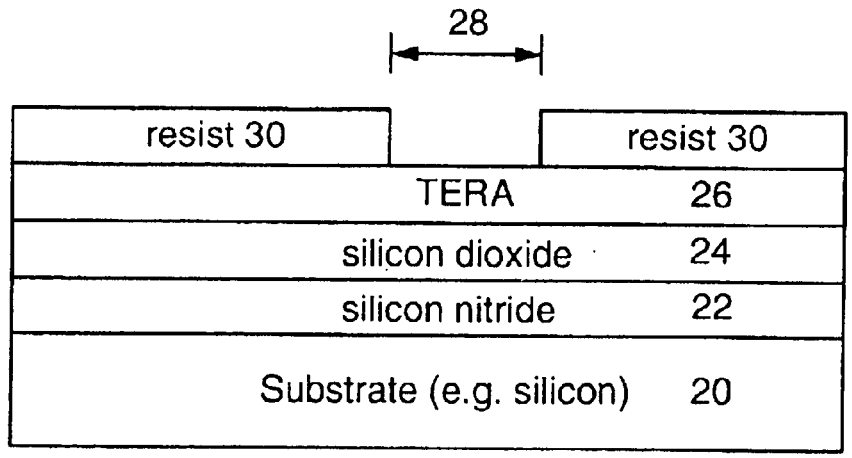
FIG. 1 shows a multilayered structure having a TERA hard mask for use with the present invention.

FIG. 1 shows a starting structure for use with the present invention. The structure comprises a substrate 20 such as silicon, a nitride layer 22, and an oxide layer 24 on the nitride layer 22. A TERA layer 26 is disposed on the oxide layer. The TERA layer 26 can function as a hard mask, ARC, or both. The resist layer 30 has an opening 28 formed by photolithography. The oxide layer 24 and nitride layer 22 can be deposited by CVD or any other technique.

The oxide-over-nitride structure of FIG. 1 is employed in several capacities in the manufacture of semiconductor devices. Examples include the following: (1) Silicon mask: The oxide functions as a mask, and the nitride functions as a polish stop. (2) Wiring levels: The nitride is used to cover copper lines so that oxidation of copper is avoided during oxide deposition; the oxide serves as a dielectric separating copper lines. (3) Via levels: In this application the oxide is the via dielectric, and etched selectively to the nitride. The nitride is removed in a gentle etch. This prevents damage to contact areas, since the nitride can be removed gently, and the oxide typically cannot be removed without damaging the silicon if it is directly on the silicon. (4) Gate spacers: The nitride serves as an etch stop.

The present invention is applicable to all these applications of oxide/nitride layers shown in FIG. 1. In fact, the present invention is applicable to any situation where the TERA layer must be stripped in a fluorine based or fluorine compatible system.

Figure 2:
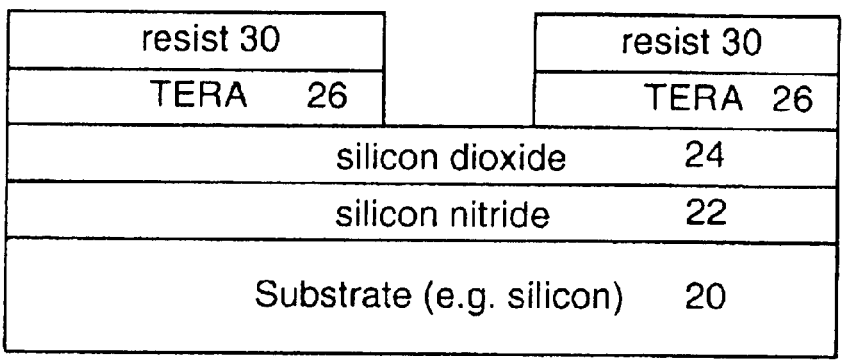
FIG. 2 shows the structure after a TERA open step.

FIG. 2 shows the structure after a TERA etch step according to the present invention. In FIG. 2 the resist 30 is used as a mask to pattern the TERA layer 26. The TERA layer 26 functions as a hard mask, and may also function as an ARC. The TERA layer 26 can be etched by processes known in the art, such as plasma etching with a high sputter component (high RF energy).

Figure 3:
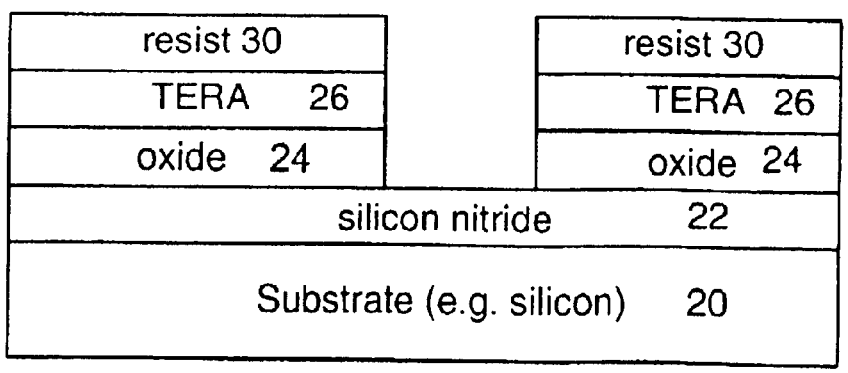
FIG. 3 shows the structure after an oxide etch step.

FIG. 3 shows the structure after an oxide etch step according to the present invention. In FIG. 3, the oxide layer 24 has been etched with a fluorine based plasma using the TERA layer 26 as a hard mask. TERA is an excellent material for use as a hard mask for the oxide etch step due to its high resistance to fluorine based etches used to etch silicon dioxide.

Figure 4:
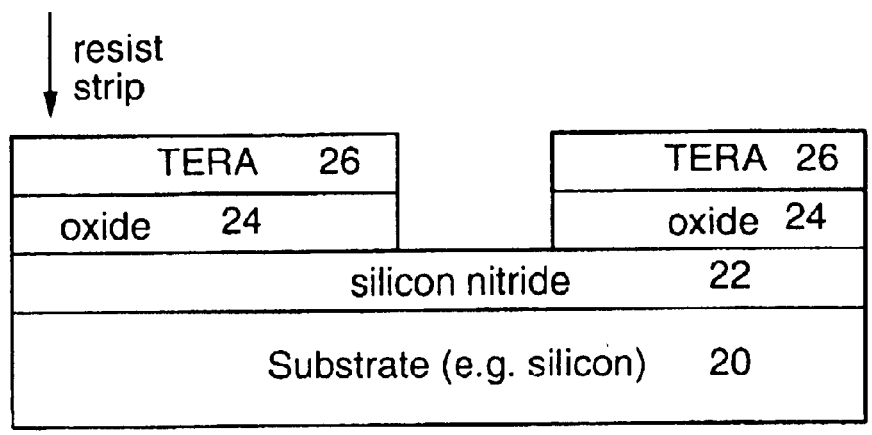
FIG. 4 shows the structure after a resist strip step.

FIG. 4 shows the structure after a resist strip step according to the present invention. In FIG. 4, the resist layer is stripped. For example, the resist can be stripped in an oxygen plasma. Resist stripping techniques are well known in the art. Alternatively, the resist may be stripped prior to the oxide etch step of FIG. 3.

Figure 5:
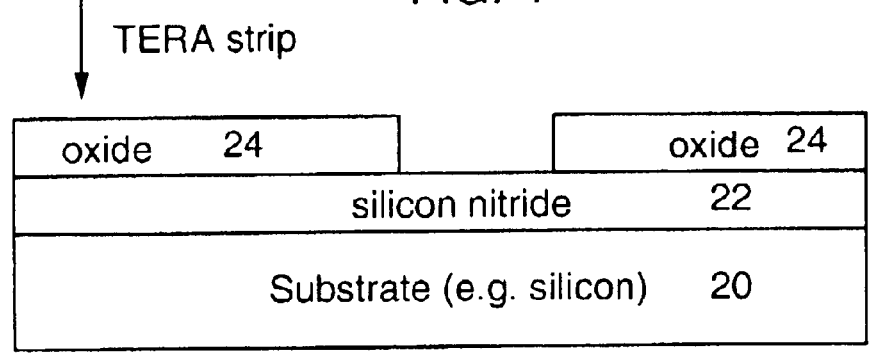
FIG. 5 shows the structure after a TERA strip step.

FIG. 5 shows the structure after a TERA strip step according to the present invention. The TERA strip step is essential in the present invention; the present invention teaches a novel method for the TERA strip step providing many benefits. In the present invention, the TERA layer 26 is stripped by adding an effective amount of nitrogen to an oxygen plasma, and exposing the TERA layer 26 to the nitrogen-oxygen plasma. Fluorocarbons may also be present in the plasma, although this is optional. The TERA layer 26 is stripped without removing the wafer from the fluorine based system employed in the oxide etch step. Nitrogen-oxygen and nitrogen-oxygen-fluorocarbon plasmas are compatible with systems designed for fluorine etch chemistry. Accordingly, the TERA layer strip step may be performed in the same system used for the oxide etch step, and used for subsequent processing steps.

Figure 6:
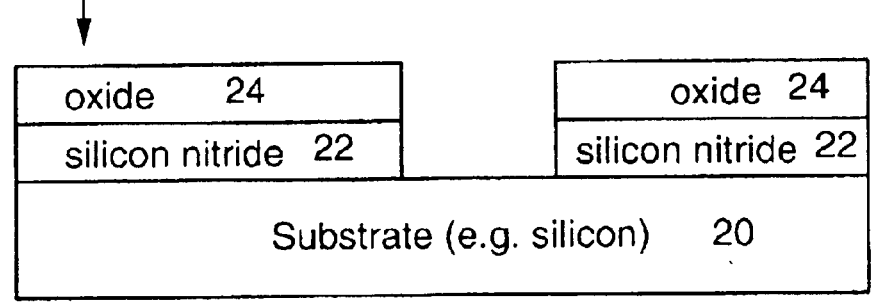
FIG. 6 shows the structure after a nitride etch step.

FIG. 6 shows the structure after a nitride etch step according to the present invention. In FIG. 6, the oxide layer 24 is used as a mask for etching the nitride layer 22. It is noted that this nitride etch step can be performed using fluorine based chemistry and hence can be performed in the same system used for the TERA strip in the previous etching step.

Figure 7:
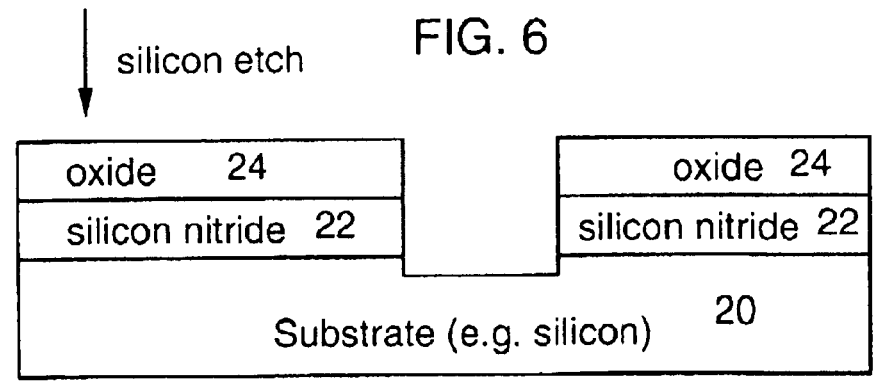
FIG. 7 shows the structure after a silicon etch step.

FIG. 7 shows the structure after a silicon etch step according to the present invention. In FIG. 7, the silicon substrate 20 is etched using the oxide layer 24 as a mask. The silicon etch step can also be performed using a fluorine based plasma.

In the present invention, the TERA strip step may be performed in the same etching system used for the TERA open step, the oxide etch step, and the nitride etch step. This provides efficiency advantages because the wafer does not have to be transported to a separate system to strip the TERA layer 26. Also, the TERA strip step according to the present invention does not unfavorably alter the profiles of the nitride etch or oxide etch steps.

The nitrogen used in the TERA strip step according to the present invention may be in any form, including elemental form ($N_2$), atomic form (N radical), $NH_3$, and $NF_3$. The oxygen may be in any form that will dissociate, such as $O_2$ (which is preferred). If fluorine is used, it is preferably used in the form of a fluorocarbon.

The plasma used for the TERA strip must contain nitrogen, and may or may not contain oxygen or fluorine. Fluorine tends to cause etching of oxide, but also causes faster etching of the TERA material. If etching oxide films must be avoided, and a high selectivity of TERA over oxide is desired (which is typically the case with a TERA strip), then the fluorine content of the plasma should be low or zero. Specifically, the atomic ratio of fluorine to the sum of oxygen and nitrogen should be in the range given by: $F/(N+O)<0.25$ or $F/(N+O)<0.1$. Satisfactory removal of carbon from TERA films can be provided by a plasma containing only nitrogen and, optionally, oxygen. Oxygen tends to increase the removal rate of carbon from the TERA, and may increase the selectivity to underlying $SiO_2$ layers.

Also, the presence of fluorine tends to provide selectivity of TERA over photoresist, when photoresist is present. In the TERA strip step, no photoresist is typically present, and therefore no selectivity is needed. However, in cases where TERA is etched in the presence of photoresist, and selectivity over photoresist is desired, fluorine can be added.

Although not wishing to be limited to a specific etching mechanism, it is believed that the nitrogen in the plasma of the present invention bonds with carbon in the TERA film, forming volatile cyanide (CN) compounds that volatize. In this way, carbon is removed from the TERA film, rendering the carbon-depleted TERA film removable by other species in the plasma (e.g. oxygen or fluorine). For example, in the case of Si—C—H—O TERA material, the nitrogen bonds with and removes the carbon, and an Si—O, or Si—OH material may remain. In many cases, a residual SiO material is acceptable, particularly if the layer under the TERA material is $SiO_2$.

The TERA material can be carbon-depleted and stripped in a single etching step, using a single etching chemistry. In this case, for example, the etching mixture can comprise an $N_2/O_2$ plasma, or an $N_2/O_2$/fluorocarbon plasma. Alternatively, the TERA material is stripped in two steps: a first step depletes the TERA material of carbon, and a distinct, subsequent step strips the carbon-depleted TERA material. For example, the TERA material may be carbon-depleted in an $N_2/O_2$ plasma, and afterwards the carbon-depleted TERA (e.g. Si—O—H material) may be stripped in a fluorocarbon plasma or nitride etch. For example, carbon-depleted TERA may be etched in fluorine-containing etch mixtures such as $CF_4/CHF_3/O_2$, or $Cl_2/O_2$.

The evolved CN compounds can be detected by spectrophotometry, and measurement of CN may then be used for process endpoint detection. When all or almost all the carbon has been removed from the TERA film, the amount of CN in the system exhaust and plasma will rapidly diminish. This will indicate that the TERA film has been carbon-depleted (e.g. converted to Si—O material), or that the TERA film has been completely stripped.

It is noted that carbon monoxide and carbon dioxide will generally impede the present TERA strip process. Chlorine and bromine will typically be excluded because they are not compatible with fluorine-based etching systems, although they may be compatible with the present TERA removal etch per se.

In the method of the present invention, relatively low RF energy intensity and low bias voltage is used for stripping the TERA material. Typically, less than 500 Watts is required for a 200 mm wafer (corresponding to an energy/wafer surface area ratio of less than 0.4 Watts/$cm^2$), although less than 200 Watts (0.16 Watts/$cm^2$) may also be used. Bias voltage of less than 200 Volts is also preferred. In general, low power and low bias voltage is preferable for the TERA strip step because high power and high bias tends to cause damage to underlying oxide and nitride films. Damage may include chamfer of the oxide corners, electrical short circuits, and loss of critical dimension (CD) control. By comparison, the TERA open step uses relatively higher power (e.g. >500 Watts) and a high sputter component. The TERA open step can use such high power because there is little risk of damaging the underlying oxide layer. Low RF energy and bias voltage for the TERA strip also helps to improve the selectivity of the TERA strip over oxide. Selectivity is important for the strip step to avoid damaging the oxide; selectivity of greater than 10:1 is possible with the method of the present invention. High selectivity is provided because Si—O bonds require a relatively high ion energy for dissociation, and will therefore tend to survive in a low-ion-energy plasma, even if it contains substantial fluorine. More generally, RF energy applied to the wafer and bias voltage should be tuned so that incident ion energy is less than about 200 eV. Such low ion energies are sufficient for causing nitrogen to remove carbon from the film, but are not high enough to damage an underlying but exposed oxide layer.

It is noted that the RF wattages specified herein and in the claims apply only to energy directly applied to the wafer or semiconductor device from which the TERA material is being stripped or carbon depleted: Decoupled plasmas (e.g. inductively excited plasmas) are understood to provide zero energy directly to the wafer.

The following table provides exemplary power and self bias voltages for 200 mm wafers for the TERA strip according to the present invention, compared to the same parameters for the oxide etch and nitride etch.

| Process Parameters for 200 mm Wafers | | |
| --- | --- | --- |
| Process | RF Power | DC Bias Voltage |
| Present TERA Strip | <500 or <200 Watts RF | <200 V |
| Oxide Etch | 1000 Watts RF | 500 V |
| Nitride Etch | 500 Watts RF | 250 V |

The RF powers, gas flows and plasma pressures quoted above apply to 200 mm plasma processing equipment. The present invention can be used with 300 mm wafers, or any other size wafer. If the present invention is applied to differently-sized wafers, the RF energy should scale with the wafer surface area. The gas flows scale with the plasma chamber volume. The plasma pressure is typically in the range of about 10–1000 mTorr.

The following are some specific etching recipes that are useful for removing carbon from TERA materials.

Recipe 1

RF Power: 150 Watts applied directly to wafer $O_2$: 20 sccm $N_2$: 100 sccm

Pressure: 40 mTorr

Plasma volume: 6 liters

F/(N+O) ratio: 0

Recipe 2

RF Power: 120 Watts applied directly to wafer.

$O_2$: 20 sccm $N_2$: 100 sccm $CHF_3$: 5 sccm

Pressure: 40 mTorr

Plasma volume: 6 liters

F/(N+O) ratio: 0.0625

It will be clear to one skilled in the art that the above embodiment may be altered in many ways without departing from the scope of the invention. Accordingly, the scope of the invention should be determined by the following claims and their legal equivalents.

We claim:

1. A method for removing carbon from a TERA layer so that the TERA layer is rendered more etchable by an oxygen or fluorine containing plasma, the method comprising the step of:

a) exposing the layer to a plasma comprising an effective amount of nitrogen, said effective amount rendering the TERA layer more etchable by an oxygen or fluorine containing plasma.

2. The method of claim 1 wherein the plasma consists essentially of nitrogen.

3. The method of claim 1 wherein the plasma further comprises at least one of oxygen and fluorine.

4. The method of claim 1 wherein the plasma has a F((N+O) ratio less than 0.25, calculated on an atomic basis.

5. The method of claim 1 further comprising the step of detecting evolved CN compounds during step (a).

6. The method of claim 5 further comprising the step of stopping step (a) when evolved CN compounds are detected below a threshold level.

7. The method of claim 1 wherein the plasma is excited with RF energy having an intensity of less than 0.4 Watts/cm$^2$ applied to the substrate.

8. The method of claim 1 wherein the TERA material comprises a Si—C—H—O material.

9. The method of claim 1 further comprising a step of removing a carbon-depleted TERA film after step (a).

10. The method of claim 1 wherein the TERA layer is disposed on a silicon dioxide layer.

11. A method for processing a semiconductor device having a patterned TERA layer disposed over an oxide layer disposed over a nitride layer over a substrate, the method comprising the steps of:
a) etching the oxide layer in a fluorine based plasma according to the TERA layer pattern;
b) removing carbon from the TERA layer by exposing the TERA layer to a plasma comprising an effective amount of nitrogen;
c) etching the nitride layer according to a pattern transferred to the oxide layer from the TERA layer.

12. The method of claim 11 wherein steps (a), (b), and (c) are performed in the same etching system without removing the semiconductor device from vacuum.

13. The method of claim 11 wherein the plasma has a F((N+O) ratio less than 0.25, calculated on an atomic basis.

14. The method of claim 11 wherein the plasma is excited with RF energy having an intensity of less than 0.4 Watts/cm$^2$ applied to the substrate.

15. A method for depleting carbon from a TERA layer disposed over a substrate comprising the step of:
a) exposing the TERA layer to a plasma comprising oxygen, fluorine and an effective amount of nitrogen, said effective amount rendering the TERA layer more etchable by the oxygen or fluorine plasma.

16. The method of claim 15 wherein the plasma has a F((N+O) ratio less than 0.25, calculated on an atomic basis.

17. The method of claim 15 further comprising the step of detecting evolved CN compounds during step (a).

18. The method of claim 17 further comprising the step of stopping step (a) when CN compounds are detected below a threshold level.

19. The method of claim 15 wherein the plasma is excited with RF energy having intensity of less than 0.4 Watts/cm$^2$ applied to the substrate.

20. The method of claim 1 wherein a top surface of the TERA layer is not covered during step (a).

21. A method for etching a TERA layer, comprising the steps of:
a) exposing the layer to a plasma comprising an effective amount of nitrogen, said effective amount removing carbon from the TERA layer and rendering a carbon-depleted TERA layer that is more etchable by an oxygen or fluorine containing plasma; and
etching the carbon-depleted TERA layer in an oxygen or fluorine containing plasma, or in a nitride etch.

* * * * *